United States Patent
Hoshikawa et al.

(10) Patent No.: US 6,498,207 B1
(45) Date of Patent: Dec. 24, 2002

(54) AQUEOUS POLYTETRAFLUOROETHYLENE DISPERSION COMPOSITION

(75) Inventors: Jun Hoshikawa, Ichihara (JP); Shigeki Kobayashi, Ichihara (JP)

(73) Assignee: Asahi Glass Fluoropolymers Co. Ltd., Ichihara (JP)

( * ) Notice: Subject to any disclaimer, the term of this patent is extended or adjusted under 35 U.S.C. 154(b) by 0 days.

(21) Appl. No.: 09/622,052

(22) PCT Filed: Feb. 24, 1999

(86) PCT No.: PCT/JP99/00840

§ 371 (c)(1),
(2), (4) Date: Aug. 24, 2000

(87) PCT Pub. No.: WO99/43750

PCT Pub. Date: Sep. 2, 1999

(30) Foreign Application Priority Data

| Feb. 24, 1998 | (JP) | 10-057354 |
| Oct. 29, 1998 | (JP) | 10-322958 |

(51) Int. Cl.$^7$ ................................ C08L 5/06
(52) U.S. Cl. .......... 524/378; 524/546; 524/369; 524/385; 524/389; 524/538; 524/198; 525/539
(58) Field of Search ................ 524/546, 502, 524/538; 525/190, 384, 385; 523/335

(56) References Cited

U.S. PATENT DOCUMENTS

| 3,301,807 A | | 1/1967 | Hoashi et al. | |
| 3,704,272 A | * | 11/1972 | Holmes | 260/29.6 F |
| 3,896,071 A | * | 7/1975 | Poirier | 260/29.6 F |
| 4,079,028 A | * | 3/1978 | Emmons et al. | 260/29.6 NR |
| 4,391,930 A | * | 7/1983 | Olson | 523/219 |
| 5,753,731 A | * | 5/1998 | Yoshioka et al. | 524/198 |
| 6,124,045 A | * | 9/2000 | Soda et al. | 428/500 |
| 6,153,688 A | * | 11/2000 | Miura et al. | 524/546 |
| 6,174,979 B1 | * | 1/2001 | Biancardi et al. | 526/247 |

FOREIGN PATENT DOCUMENTS

| GB | 1 476 272 | | 6/1977 |
| JP | 47-6538 | | 4/1972 |
| JP | 47-14774 B | * | 5/1972 |
| JP | 47-014774 | | 5/1972 |
| JP | 47-014790 | | 5/1972 |
| JP | 49-76944 | | 7/1974 |
| JP | 55-093675 | | 7/1980 |
| JP | 62-541 | | 1/1987 |
| JP | 1-289896 | | 11/1989 |
| JP | 4-045168 | | 2/1992 |
| JP | 8-269285 | | 10/1996 |
| JP | 9-71766 | | 3/1997 |
| JP | 9-71767 | | 3/1997 |
| JP | 2000-160118 | | 6/2000 |
| JP | 2001-89624 | | 4/2001 |

* cited by examiner

*Primary Examiner*—David W. Wu
*Assistant Examiner*—Rip A Lee
(74) *Attorney, Agent, or Firm*—Oblon, Spivak, McClelland, Maier & Neustadt, P.C.

(57) ABSTRACT

A composition comprising from 30 to 65 wt % of fine particles of PTFE, and, based on PTFE, from 2 to 12 wt % of $C_{10}H_{21}CH(CH_3)CH_2O(C_2H_4O)_9C_3H_6OH$ and at least 0.01 wt % and less than 1 wt % of a polyethylene oxide having an average molecular weight of from 100,000 to 2,000,000.

11 Claims, No Drawings

AQUEOUS POLYTETRAFLUOROETHYLENE DISPERSION COMPOSITION

TECHNICAL FIELD

The present invention relates to a PTFE aqueous dispersion composition containing fine particles of polytetrafluoroethylene (hereinafter referred to as PTFE).

BACKGROUND ART

PTFE by an emulsion polymerization method is usually produced by injecting and polymerizing tetrafluoroethylene (hereinafter referred to as TFE) monomer under pressure while adding and stirring a peroxide type polymerization initiator, an anionic dispersant and a higher paraffin or the like as a polymerization stabilizer, to pure water. Usually, an aqueous dispersion will be obtained wherein fine particles of PTFE having an average particle size of from 0.1 to 0.5 μm are dispersed at a concentration of about 30 wt % or lower.

This aqueous dispersion is very unstable by itself, and it has been common that a nonionic surfactant such as a polyoxyethylene alkyl phenyl ether, e.g. Triton X 100, manufactured by Union Carbide having a molecular structure of $C_8H_{17}C_6H_4O(C_2H_4O)_{10}H$, is added for primary stabilization, followed by concentration to a PTFE solid content of from 40 to 65 wt % by a known method such as an electrical concentration method or a phase separation method. Thereafter, in order to obtain a liquid physical property such as a viscosity suitable for various applications or stabilization during storage for a long period of time, water, an antiseptic such as ammonia, a surfactant, etc., are added to obtain an aqueous dispersion composition having a PTFE concentration of from 30 to 65 wt %.

However, there has been a problem that if a frictional action or a shearing action is exerted to the conventional PTFE aqueous dispersion composition, PTFE particles tend to be fibrous and agglomerate, whereby the uniformity of the dispersion tends to be impaired.

Specifically, when a PTFE aqueous dispersion composition is transported or circulated by a pump, if the operation time prolongs, agglomerates of PTFE are likely to be formed in the PTFE aqueous dispersion composition by a frictional action or a shearing action, whereby there has been a problem that the pump is likely to be clogged, the valve operation is likely to be impaired, or the filter is likely to be clogged.

Further, there has been a problem that when an excess PTFE aqueous dispersion composition coated on a substrate such as a glass fiber cloth or a metal foil, is to be removed by a doctor bar, agglomerates of PTFE formed by a frictional action, tend to deposit on the substrate, thus leading to drawbacks such as irregularity in thickness or foreign matters to deteriorate the yield of the product.

JP-B-53-6993 proposes a method of incorporating at least 1 wt % of an alkylene oxide polymer to PTFE for the purpose of preventing sedimentation of fine particles of PTFE, but discloses nothing about stability against the frictional action or the shearing action of the liquid. The polyethylene glycol having a relatively low molecular weight i.e. a molecular weight of from 1300 to 15000 disclosed in Examples of this specification was not one having an adequate effect for improving the frictional stability.

Further, a film prepared from a PTFE aqueous dispersion composition employing a conventional polyoxyethylene alkyl phenyl ether type surfactant, has had a problem that it is likely to be colored, and the electrical characteristic such as an insulating property tends to deteriorate.

JP-A-8-269285 discloses that a film prepared from an aqueous dispersion composition employing a polyoxyethylene alkyl ether type surfactant having a cloud point of from 48 to 85° C. and a content of ethylene oxide groups of from 65 to 70 wt %, such as $RO(C_2H_4O)_nH$ (wherein R is a $C_{8-18}$ linear alkyl group, and n is from 5 to 20), has coloration suppressed. However, this aqueous dispersion composition has the following problem. Namely, foams formed by stirring are hardly extinguishable, and if such foams will attach, traces of foams will bring about irregularities in the thickness of the PTFE film, and the strength, etc. of the film may deteriorate, thus leading to non-uniformity, and when the aqueous dispersion composition is subjected to multi-coating to prepare a thick film, the sintered PTFE surface has a low surface tension and is repelling, whereby multi-coating tends to be difficult.

DISCLOSURE OF THE INVENTION

The present invention has an object to improve a PTFE aqueous dispersion composition excellent in friction stability or shearing stability.

The present invention has an object to provide a PTFE aqueous dispersion composition whereby foams formed by stirring are readily extinguishable and multi-coating is possible, and a sintered PTFE film is free from coloration.

The present invention is a polytetrafluoroethylene aqueous dispersion composition, which comprises from 30 to 65 wt % of fine particles of polytetrafluoroethylene obtainable by emulsion polymerization, from 2 to 12 wt %, based on the polytetrafluoroethylene, of a nonionic surfactant, and at least 0.01 wt % and less than 1 wt %, based on the polytetrafluoroethylene, of at least one member selected from a polyethylene oxide having an average molecular weight of from 100,000 to 2,000,000 and an association type thickener based on a water-soluble polyurethane as essential components.

The present invention is the polytetrafluoroethylene aqueous dispersion composition, wherein the nonionic surfactant is at least one member selected from nonionic surfactants having molecular structures represented by the Formulae (1) and (2):

R—O—A—H　(1)

(wherein R is an alkyl group having a straight chain or a branched chain represented by $C_xH_{2x+1}$ where x=8 to 18, and A is a polyoxyalkylene chain constituted by from 5 to 20 oxyethylene groups and from 0 to 2 oxypropylene groups)

R'—C₆H₄—O—A'—H　(2)

(wherein R' is an alkyl group having a straight chain or a branched chain represented by $C_{x'}H_{2x'+1}$ where x'=4 to 12, and A' is a polyoxyethylene chain constituted by from 5 to 20 oxyethylene groups).

Further, the present invention is the PTFE aqueous dispersion composition, wherein the nonionic surfactant is a nonionic surfactant having a molecular structure represented by the Formula (1) wherein x is from 10 to 16, and A is a polyoxyalkylene chain constituted by from 7 to 12 oxyethylene groups and from 0 to 2 oxypropylene groups.

Further, the present invention is the PTFE aqueous dispersion composition, wherein the nonionic surfactant is a nonionic surfactant having a molecular structure represented by the Formula (2) wherein x' is from 10 to 16, and A' is a polyoxyalkylene chain constituted by from 7 to 12 oxyethylene groups.

The present invention is a polytetrafluoroethylene aqueous dispersion composition, which comprises from 30 to 65 wt % of fine particles of polytetrafluoroethylene obtainable by emulsion polymerization, and from 2 to 12 wt %, based on the polytetrafluoroethylene, of a nonionic surfactant having a molecular structure represented by the Formula (3):

R—O—B—H                        (3)

(wherein R is an alkyl group having a straight chain or a branched chain represented by $C_xH_{2x+1}$ where x=8 to 18, and B is a polyoxyalkylene chain constituted by from 5 to 20 oxyethylene groups and from 1 to 2 oxypropylene groups).

Further, the present invention is the PTFE aqueous dispersion composition, wherein the nonionic surfactant is a nonionic surfactant having a molecular structure represented by the Formula (3) wherein x is from 10 to 16, and B is a polyoxyalkylene chain constituted by from 7 to 12 oxyethylene groups and from 1 to 2 oxypropylene groups.

BEST MODE FOR CARRYING OUT THE INVENTION

The fine particles of PTFE in the PTFE aqueous dispersion composition of the present invention are those obtainable by emulsion polymerization, and they can be produced by a conventional emulsion polymerization method.

The average particle size of the fine particles of PTFE is usually within a range of from 0.1 to 0.5 μm, particularly preferably within a range of from 0.15 to 0.3 μm.

Further, the average molecular weight of PTFE is suitably within a range of from a 1,000,000 to 100,000,000. If it is too small, the strength of PTFE tends to be low, and if it is too large, industrial polymerization tends to be difficult.

Further, the average molecular weight is obtained from a method by Suwa et al. (Journal of Applied Polymer Science, 17, 3253—(1973)) using heat of crystallization obtained by differential thermal analysis.

In the present invention, PTFE includes not only a homopolymer of TFE but also a so-called modified PTFE which contains a small amount of polymer units based on a component co-polymerizable with TFE, such as a halogenated ethylene such as chlorotrifluoroethylene, a halogenated propylene such as hexafluoropropylene or a fluorovinyl ether such as a perfluoro(alkylvinyl ether) and which is not substantially melt-processable.

In the PTFE aqueous dispersion composition of the present invention, the content of the fine particles of PTFE is from 30 to 65 wt %, preferably from 50 to 62 wt %. If it is lower than the above range, the fine particles of PTFE tend to be sedimented because of a low viscosity, and if it is higher than the above range, processing tends to be difficult because of high viscosity.

In the PTFE aqueous dispersion composition of the present invention, at least one member selected from a polyoxyalkylene alkyl ether type nonionic surfactant of the above Formula (1) and a polyoxyethylene alkyl phenyl ether type nonionic surfactant of the Formula (2), is employed. In the Formulae (1) and (3), R which is a hydrophobic group, is an alkyl group, and the value of x representing the chain length of the alkyl group is within a range of from 8 to 18, preferably from 10 to 16. If x is too small, the PTFE aqueous dispersion composition tends to have a high surface tension, whereby the wettability tends to be low. Inversely, if x is too large, when the dispersion is left to stand for a long time, the fine particles of PTFE are likely to be sedimented, whereby the storage stability of the PTFE aqueous dispersion composition tends to be impaired.

Further, in the Formulae (1) and (3), if the alkyl group as a hydrophobic group, has a branched structure, the wettability will be improved, and a suitable aqueous dispersion composition can be obtained, such being preferred.

In the Formula (1), A which is a hydrophilic group, is a polyoxyalkylene chain constituted by from 5 to 20 oxyethylene groups and from 0 to 2 oxypropylene groups. A polyoxyalkylene chain constituted by from 7 to 12 oxyethylene groups and from 0 to 2 oxypropylene groups is preferred from the viewpoint of the viscosity and the stability. Particularly preferred is a case where it has from 0.5 to 1.5 oxypropylene groups in the hydrophilic group A, whereby the defoaming property will be good.

In A, the oxypropylene groups may be present in the polyoxyethylene chain or may be bonded to the polyoxyethylene chain terminals. However, when they are bonded to the polyoxyethylene chain terminals, the defoaming property will be good, and particularly when they are bonded to the molecular terminal side of the two polyoxyethylene chain terminals, the defoaming property will be better, such being preferred.

Specific examples of the nonionic surfactant of the Formula (1) include, for example, surfactants having molecular structures $C_{13}H_{27}O(C_2H_4O)_{9\text{-}10}H$, $C_{10}H_{21}CH(CH_3)CH_2O(C_2H_4O)_{10}H$, $C_{10}H_{21}CH(CH_3)CH_2O(C_2H_4O)_{9\text{-}10}OC_3H_6OH$, $C_{12}H_{25}O(C_2H_4O)_{10}H$, $C_{16}H_{33}O(C_2H_4O)_{10\text{-}11}H$, and $C_{10}H_{33}O(C_2H_4O)_{6\text{-}7}H$ (provided that an alkyl group other than the branched structural moiety is of a straight chain structure, and the same applies in the following specific examples). The nonionic surfactants, of the Formula (1) may be used alone or as a plural mixture of them.

In the Formula (2), R' as a hydrophobic group, is an alkyl group, and the value of x' representing the chain length of the alkyl group is from 4 to 12, preferably from 6 to 10. If x' is too small, the PTFE aqueous dispersion composition tends to have a high surface tension, whereby the wettability tends to be low. Inversely, if x' is too large, when the dispersion is left to stand for a long time, the fine particles of PTFE are likely to be sedimented, whereby the storage stability tends to be impaired.

Further, A' which is a hydrophilic group, is a polyoxyethylene chain having from 5 to 20 oxyethylene groups. From 7 to 12 oxyethylene groups are particularly preferred from the viewpoint of the viscosity and the stability.

Specific examples of the nonionic surfactant of the Formula (2) include, for example, $C_9H_{19}C_6H_4O(C_2H_4O)_{9\text{-}10}H$ and $C_8H_{17}C_6H_4O(C_2H_4O)_{9\text{-}10}H$. The nonionic surfactants of the Formula (2) may be used alone or as a plural mixture of them.

Among the nonionic surfactants of the Formulae (1) and (2) in the present invention, it is novel to use a compound of the Formula (3) as a nonionic surfactant in a PTFE aqueous dispersion composition. By the use of the nonionic surfactant of the Formula (3), it is possible to obtain a PTFE aqueous dispersion composition whereby foams formed by stirring are readily extinguishable, multi-coating is possible, and a sintered PTFE film is free from coloration.

In the Formula (3), B which is a hydrophilic group, is a polyoxyalkylene chain constituted by from 5 to 20 oxyethylene groups and from 1 to 2 oxypropylene groups, particularly preferably a polyoxyalkylene chain having from 7 to 12 oxyethylene groups and from 1 to 2 oxypropylene groups from the viewpoint of the viscosity and the stability.

In B, the oxypropylene groups may be present in the polyoxyethylene chain or may be bonded to the terminals of the polyoxyethylene chain. However, when they are bonded to the terminals of the polyoxyethylene chain, the defoaming property will be good, and particularly when they are bonded to the molecular terminal side of the two polyoxyethylene chain terminals, the defoaming property will be better, such being preferred.

When B contains no oxypropylene group, the defoaming property tends to be low. When oxypropylene groups are three or more, the surface tension tends to be high, and the wettability tends to be low, and at the time of multi-coating, "cissing" or "pockmarks" is likely to result.

Specific examples of the nonionic surfactant of the Formula (3) include, for example, surfactants having molecular structures such as $C_{13}H_{27}O(C_2H_4O)_8C_3H_6OH$, $C_{13}H_{27}O(C_2H_4O)_9C_3H_6OH$, $C_{13}H_{27}O(C_2H_4O)_{10}(C_3H_6O)_2H$, and $C_{16}H_{27}(C_2H_4O)_{12}(C_3H_6O)_2H$. The nonionic surfactants of the Formula (3) may be used alone or as a plural mixture of them.

Further, the molecular structure of the nonionic surfactant is a mixture of plural substances having a certain distribution, and the carbon number of the alkyl group in the nonionic surfactants and the numbers of the oxyethylene groups and the oxypropylene groups in the oxyalkylene group will be represented by average values. Each numerical value is not limited to an integer.

In the present invention, the nonionic surfactant to be used for improvement of the friction stability may be the nonionic surfactant of the Formula (1) alone, the nonionic surfactant of the Formula (2) alone or a combination of the nonionic surfactant of the Formula (1) and the nonionic surfactant of the Formula (2).

Further, in the present invention, when the nonionic surfactant represented by the Formula (1) is used, the effect for improvement of the friction stability is particularly remarkable.

Further, in the PTFE aqueous dispersion composition of the present invention, the content of the nonionic surfactant of the Formula (1), (2) or (3) is from 2 to 12 wt % based on the fine particles of PTFE. If it is smaller than this range, the fine particles of PTFE tends to agglomerate due to a mechanical stress such as stirring, whereby the stability tends to deteriorate. If the surfactant is incorporated in a large amount, such will be suitable for an application for thick coating, but if it is too much, the thermally decomposed gas of the surfactant will increase at the time of sintering, thus causing a bad odor, and microcracks are likely to form in the coated layer. Preferably, it is from 4 to 12 wt %.

In the present invention, a polyethylene oxide is employed as a friction stabilizer. The average molecular weight of the polyethylene oxide is within a range of from 100,000 to 2,000,000, preferably within a range of from 100,000 to 1,000,000. This polyethylene oxide can be obtained by polymerizing ethylene oxide, or by adjusting the molecular weight of such a polymer by applying a radiation, an electron ray, heat, a mechanical stress or other means to the polymer to suitably cause the main chain scission. Further, the polyethylene oxide may be one containing propylene oxide or other copolymer units in a degree not to impair the water-solubility.

If the average molecular weight is larger than the above range, so-called stringiness, a string-forming phenomenon of the aqueous dispersion, tends to occur, whereby processing tends to be difficult, and the viscosity reduction or the property change of the aqueous dispersion tends to be substantial, such being undesirable. And, if it is small, it tends to be difficult to obtain an adequate effect for friction stability.

The added amount of the polyethylene oxide is at least 0.01 wt % and less than 1 wt %, particularly preferably from 0.1 to 0.5 wt %, based on PTFE. If the added amount is too small, the friction stability tends to be low, and if it is too large, the thermal decomposition product at the time of sintering tends to be substantial, and the viscosity of the liquid tends to increase, such being undesirable.

Further, if the polyethylene oxide is added to the PTFE aqueous dispersion composition, so-called clusters are likely to form by inclusion of air during the dissolution. Accordingly, a method of preliminarily dissolving or dispersing it in water or in a water-soluble organic solvent such as isopropyl alcohol, propylene glycol, ethylene glycol or polyethylene glycol, and then adding it, may suitably be selected.

In the present invention, an association type thickener based on a water-soluble polyurethane is employed as a friction stabilizer. The association type thickener based on a water-soluble polyurethane is obtainable by reacting a polyisocyanate with a polyalkylene ether alcohol or by reacting a polyisocyanate with a polyalkylene ether polyol and a polyalkylene ether alcohol. It is one having at least two hydrophobic groups and a hydrophilic group made of a polyoxyalkylene composed mainly of oxyethylene groups with a polymerization degree of from 1 to 500. As its specific examples, JP-A-9-71766 and JP-A-9-71767 disclose compounds represented by the following molecular Formulae:

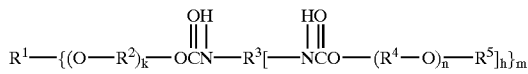

(wherein $R^1$ is a m-valent hydrocarbon group, each of $R^2$ and $R^4$ which may be the same or different from each other, is an alkylene group, $R^3$ is a (h+1)-valent hydrocarbon group which may have a urethane bond, $R^5$ is a branched hydrocarbon group, m is a number of at least 2, h is a number of at least 1, each of k and n is a number of from 1 to 500, and $R^2$ and $R^4$ are preferably ethylene groups.)

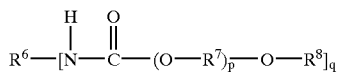

(wherein $R^6$ is a q-valent hydrocarbon group which may have a urethane bond, R is an alkylene group, $R^8$ is a branched hydrocarbon group, p is a number of from 1 to 500, q is a number of at least 1, and $R^7$ is preferably an ethylene group.)

Further, as a commercial product, Adecanol UH series (manufactured by Asahi Denka Kogyo K.K.), TAFIGEL PUR series (manufactured by MUNZING CHEMIE GMBH) or SN thickener 603, 604, 612 or 614 (manufactured by SUN-NOPCO K.K.) may, for example, be used.

The added amount of the association type thickener based on the water-soluble polyurethane is at least 0.01 wt % and less than 1 wt %, based on PTFE. It is particularly preferably from 0.1 to 0.5 wt %. If the added amount is too small, the effect for friction stabilization tends to be small, and if it is too large, the thermal decomposition product during sintering tends to be substantial, and the viscosity of the liquid tends to increase, such being undesirable.

The reason for the improvement of the friction stability of the PTFE aqueous dispersion composition by the addition of the above polyethylene oxide or the association type thickener based on the water-soluble polyurethane, is not clearly understood. It is conceivable that when a frictional stress or a shearing stress is exerted to the fine particles of PTFE, the particles will slip among themselves by the lubricating function of the stabilizer, whereby coagulation by contact of the PTFE particles one another will be prevented. It is considered that polyethylene glycols or other thickeners having relatively low molecular weights have low effects for improvement of the friction stability, since their lubricating functions are small. Further, among polymers of ethylene oxide, those having molecular weights of at most about 20,000, are usually called polyethylene glycols and are distinguished from those having larger molecular weights, which are called polyethylene oxides. The polyethylene oxide and the association type thickener based on the water-soluble polyurethane to be used as friction stabilizers, may be used in combination.

To the PTFE aqueous dispersion composition of the present invention, components such as fluorine type or silicone type nonionic surfactants, anionic surfactants, thixotropic agents, various salts, water-soluble organic solvents, antiseptics such as ammonia, various leveling agents, coloring agents, pigments, dyes or fillers, may be optionally added, as the case requires.

The viscosity of the PTFE aqueous dispersion composition of the present invention is preferably within a range of from 10 to 50 mPs as measured at 23° C. If it is lower than this range, the PTFE particles are likely to sediment, whereby the standing stability tends to be impaired, and if it is higher than this range, the amount, applied at the time of coating, tends to be large, such being undesirable.

As a method for producing the PTFE aqueous dispersion composition of the present invention, a method may be mentioned wherein the nonionic surfactant of the Formula (1), (2) or (3) is added to the emulsion polymerization solution for primary stabilization, followed by concentration to a PTFE solid content of from 40 to 65 wt % by means of a known method such as an electrical concentration method or a phase separation method, and further by adjustment to a liquid physical properties suitable for various applications or for stabilization for storage for a long period of time, and if necessary, from 0.01 to 1 wt % of an antiseptic such as ammonia, a nonionic surfactant, a friction stabilizer, etc., are added to obtain an aqueous dispersion composition having a PTFE concentration of from 30 to 65 wt %.

The amount of the nonionic surfactant of the Formula (1), (2) or (3) added to the emulsion polymerization solution for primary stabilization, is preferably from 2 to 12 wt %, particularly preferably from 2 to 8 wt %, based on PTFE.

Now, the present invention will be described in further detail with reference to Examples and Comparative Examples, but these will by no means restrict the present invention.

Here, working Examples are Examples 1 to 5 and 12 to 14, and Comparative Examples are Examples 6 to 11 and 15.

A method for preparing a sample and an evaluation method of each item will be shown below.

(A) Surface tension: The surface tension of a PTFE aqueous dispersion composition was measured by a ring method using a platinum wire ring.

(B) Viscosity: The viscosity of a PTFE aqueous dispersion was measured by means of a Brookfield viscometer at a liquid temperature of 23° C. using #1 spindle at 60 rpm.

(C) Friction stability: Using a tube type pump having a TYGON tube with an outer diameter of 7.9 mm and an inner diameter of 4.8 mm mounted, 100 cc of a PTFE aqueous dispersion composition in a 200 cc beaker was circulated for two hours at a liquid transporting amount of 200 cc per minute at room temperature of 23° C., whereupon coagulates were collected by a 200 mesh nylon filter and the weight of the coagulates, dried at 120° C. for one hour, was measured. Here, if the amount of the coagulates was 0.6 g or less, the stability was rated as good, and if it was 1 g or more, the stability was rated as poor.

(D) Thermal stability test: A PTFE aqueous dispersion composition was left to stand at 50° C. for 200 hours while simply stirring up and down once per day, and the viscosity and the friction stability were measured.

(E) Stringiness: A PTFE aqueous dispersion composition was dropped by using a dropping pipette, and the presence or absence of stringing was visually determined.

(F) Standing stability: A PTFE aqueous dispersion composition was left to stand in a 100 ml measuring cylinder at room temperature for two months, whereupon the thickness of the formed supernatant layer and the thickness of the residue at the bottom were measured. If such values are not more than 10 mm upon expiration of two months, the composition can be used without any practical problem.

(G) Defoaming property: 100 ml of a PTFE aqueous dispersion composition was put into a 500 ml measuring cylinder, air was brown thereinto by means of a diffuser stone, and after the height of the foam became 200 mm, air was stopped, and the composition was left to stand naturally for 5 minutes, whereupon the height of the foam was measured.

(H) Thickness of PTFE film: Using an eddy-current thickness tester, the average value of measurements at 10 points and the standard deviation were measured.

(I) Tensile strength: Test specimens were punched out by a micro dumbbell, and a tensile test was carried out by means of an Instron type tensile tester at 23° C. with a distance between chucks being 35 mm at a tensile speed of 100 mm/min. Five specimens are measured, and the average value of the tensile strength and the standard deviation were calculated. The degree of fluctuations of the tensile strength was judged in accordance with the following standards.

Large fluctuations: Standard deviation>$10(\times 10^6/m^2$ (hereinafter represented by $MN/m^2$))

Small fluctuations: Standard deviation<$5(MN/m2)$ (J) Degree of coloration of e.g. a PTFE film, a glass fiber cloth or the like:

The object is placed on white paper and visually evaluated.

(K) Sedimentation stability: A PTFE aqueous dispersion composition was left to stand in a 100 ml measuring cylinder at room temperature for one month, whereupon good or not was judged on such a basis that formation of the supernatant and formation of the sedimented product at the bottom are remarkable or not.

Average molecular structures of surfactants used in the respective Examples are shown in Table 1.

TABLE 1

| Type of surfactant | Average molecular structure |
| --- | --- |
| Surfactant (a) | $C_{10}H_{21}CH(CH_3)CH_2O(C_2H_4O)_9C_3H_6OH$ |
| Surfactant (b) | $C_{13}H_{27}O(C_2H_4O)_9H$ (straight chain) |
| Surfactant (c) | $C_{12}H_{25}O(C_2H_4O)_9H$ (straight chain) |
| Surfactant (d) | $C(CH_3)_3CH_2C(CH_3)_2C_6H_4O(C_2H_4O)_9H$ |

EXAMPLE 1

By emulsion polymerization, an aqueous dispersion having an average particle size of fine particles of PTFE of 0.25

μm, an average molecular weight of 4,000,000 and a concentration of 20 wt %, was obtained. Surfactant (a) was added thereto in a proportion of 5 wt % based on PTFE for primary stabilization, the concentration was carried out by an electrical concentration method, and the supernatant was removed to obtain a concentrated liquid comprising 63 wt % of PTFE and 2.5 wt %, based on PTFE, of surfactant (a).

To this concentrated liquid, 2.5 wt %, based on PTFE, of surfactant (a) was additionally added, water and 200 ppm of ammonia were added, and then a polyethylene oxide having a molecular weight of 500,000 (reagent manufactured by Wako Jyunyaku) as a friction stabilizer was added in an amount of 0.4 wt % based on PTFE, followed by stirring for two hours, to obtain a dispersion composition as shown in Table 2.

The pH of this dispersion composition was 9.5, the surface tension was low at a level of 33.0 ($\times 10^{-3}$ N/m), and the wettability was good. Further, the viscosity at the initial stage was 29.3 mP·s, and the amount of agglomerates formed in the friction stability test was good at a level of 0.42 g. In the thermal stability test, the viscosity and the frictional stability were stable without no substantial change from the initial values. There was no stringing, and the standing stability was also good. The composition and the evaluation results of the dispersion are shown in Table 2.

EXAMPLES 2 to 5

Using the same aqueous dispersion obtained by emulsion polymerization as in Example 1, the dispersion compositions as identified in Table 2 were obtained. The dispersion compositions were evaluated in the same manner as in Example 1. The results are shown in Table 2.

EXAMPLE 6

A dispersion composition was obtained in the same manner as in Example 1 except that no friction stabilizer was added. The friction stability of this dispersion composition was poor.

EXAMPLES 7 to 11

Dispersion compositions were obtained by adding friction stabilizers as identified in Table 3. The compositions of the dispersion compositions and the evaluation results are shown in Table 3.

TABLE 2

| | | | Example 1 | Example 2 | Example 3 | Example 4 | Example 5 |
|---|---|---|---|---|---|---|---|
| Composition of the dispersion | PTFE concentration (wt %) | | 60 | 57 | 60 | 60 | 60 |
| | Surfactant | Type | (a) | (a) | (b) | (c) | (d) |
| | | Concentration (wt %/PTEE) | 5 | 7.5 | 5 | 5 | 6 |
| | Friction stabilizer | Type | Polyoxyethylene oxide Average molecular weight: 500,000 | Polyoxyethylene oxide Average molecular weight: 1,000,000 | TAFIGEL PUR 40 | Adecanol UH140S | Polyoxyethylene oxide Average molecular weight: 200,000 |
| | | Concentration (wt% of solid content/PTFE) | 0.4 | 0.3 | 0.2 | 0.5 | 0.2 |
| Properties of the dispersion | pH | | 9.5 | 9.4 | 9.5 | 9.4 | 9.6 |
| | Surface tension ($\times 10^{-3}$ N/m) | | 33.0 | 32.9 | 33.1 | 33.3 | 35.5 |
| | Thermal stability test | Initial Viscosity (mPs) | 29.3 | 28.7 | 30.2 | 30.4 | 23.1 |
| | | Friction stability (amount of agglomerates (g)) | 0.42 | 0.36 | 0.44 | 0.47 | 0.43 |
| | | After 200 hrs at 50° C. Viscosity (mPs) | 28.7 | 27.1 | 29.4 | 29.6 | 22.5 |
| | | Friction stability (amount of agglomerates (g)) | 0.51 | 0.54 | 0.51 | 0.46 | 0.50 |
| | Stringiness (Initial) | | Nil | Nil | Nil | Nil | Nil |
| | Standing stability (2 months at room temperature) | Thickness of supernatant layer (mm) | 7 | 5 | 9 | 8 | 7 |
| | | Thickness of the sedimented layer (mm) | 7 | 5 | 9 | 8 | 7 |
| Overall evaluation | | | Good | Good | Good | Good | Good |

TABLE 3

| | | | Example 6 | Example 7 | Example 8 | Example 9 | Example 10 | Example 11 |
|---|---|---|---|---|---|---|---|---|
| Composition of the | PTFE concentration (wt %) | | 60 | 60 | 60 | 60 | 60 | 60 |
| | Surfactant | Type | (a) | (a) | (a) | (a) | (a) | (d) |
| | | Concentration | 5 | 5 | 5 | 5 | 5 | 5 |

TABLE 3-continued

|  |  |  |  | Example 6 | Example 7 | Example 8 | Example 9 | Example 10 | Example 11 |
|---|---|---|---|---|---|---|---|---|---|
| dispersion | Friction stabilizer | (wt %/PTEE) Type |  | Nil | Polyoxyethylene glycol Average molecular weight: 6,000 | Polyoxyethylene oxide Average molecular weight: 70,000 | Polyoxyethylene oxide Average molecular weight: 4,000,000 | Hydroxyethyl cellulose | Nil |
|  |  | Concentration (wt % of solid content/PTFE) |  | — | 2 | 1 | 0.07 | 0.07 | — |
| Properties of the dispersion | pH |  |  | 9.5 | 9.3 | 9.5 | 9.5 | 9.4 | 9.6 |
|  | Surface tension (×10$^{-3}$ N/m) |  |  | 33.2 | 33.2 | 33.1 | 33.1 | 33.3 | 35.5 |
|  | Thermal stability test | Initial | Viscosity (mPs) | 18.8 | 25.4 | 28.4 | 29.7 | 32.2 | 19.1 |
|  |  |  | Friction stability (amount of agglomerates (g)) | 3.4 | 2.1 | 2.2 | 0.52 | 0.62 | 1.14 |
|  |  | After 200 hrs at 50° C. | Viscosity (mPs) | 18.7 | 24.8 | 25.4 | 20.2 | 24.6 | 19.1 |
|  |  |  | Friction stability (amount of agglomerates (g)) | 3.58 | 2.42 | 2.29 | 2.74 | 0.66 | 1.13 |
|  | Stringiness (Initial) |  |  | Nil | Nil | Nil | Substantial | Nil | Nil |
|  | Standing stability (2 months at room temperature) |  | Thickness of supernatant layer (mm) | 8 | 7 | 7 | 7 | 35 | 8 |
|  |  |  | Thickness of the sedimented layer (mm) | 8 | 7 | 7 | 7 | 15 | 8 |
| Overall evaluation |  |  |  | Poor friction stability | Poor friction stability | Poor friction stability | Stringiness observed. Poor thermal stability | Poor sedimentation stability | Friction stability inferior to Example 5 |

EXAMPLE 12

To the same concentrated liquid obtained by emulsion polymerization as in Example 1, surfactant (a) was added in an amount of 2.5 wt % based on PTFE, and water and 200 ppm of ammonia were added to obtain a dispersion composition having a PTFE concentration of 60 wt %, wherein surfactant (a) was 5 wt % based on PTFE. The initial viscosity at 23+ C. of this dispersion composition was 19.7 mP·s, the pH was 9.4, the surface tension was 33.4 (×10$^{-3}$ N/m), and the defoaming property was good, as the height of the foam after 5 minutes in the defoaming test was as low as 100 mm.

Then, the obtained dispersion composition was coated on an aluminum plate having a length of 20 cm and a width of 15 cm and a thickness of 0.2 mm by means of a bar coater, dried at 120° C. for 10 minutes, sintered at 380° C. for 20 minutes and then naturally cooled. On the formed PTFE layer, coating, drying and sintering were further repeated twice to form a PTFE layer having a total of three layers multi-coated. This layer was peeled to obtain a PTFE film having a thickness of about 33.5 μm. During the coating, no "cissing" or "pockmarks" was observed, and the fluctuation in the thickness of the film was small. The tensile strength of the film was high, and no yellowing was observed on the film. The composition of the dispersion and the evaluation results are shown in Table 4.

EXAMPLES 13 to 15

Using the same aqueous dispersion obtained by emulsion polymerization as in Example 1, the dispersion compositions shown in Table 4 were evaluated in the same manner as in Example 12. The evaluation results are shown in Table 4.

TABLE 4

|  |  |  | Example 12 | Example 13 | Example 14 | Example 15 |
|---|---|---|---|---|---|---|
| Composition of the dispersion | PTFE concentration (wt %) |  | 60 | 57 | 60 | 60 |
|  | Surfactant | Type | (a) | (a) | (a) | (c) |
|  |  | Concentration (wt %/PTFE) | 5 | 10 | 3 | 5 |
| Properties of the dispersion | Viscosity (23° C.) (mPs) |  | 19.7 | 22.5 | 16.2 | 17.2 |
|  | PH |  | 9.4 | 9.5 | 9.3 | 9.3 |
|  | Surface tension (×10$^{-3}$ N/m) |  | 33.4 | 33.2 | 33.8 | 34.4 |

TABLE 4-continued

| | | | Example 12 | Example 13 | Example 14 | Example 15 |
|---|---|---|---|---|---|---|
| | Height of foam after 5 min (mm) | | 10 | 10 | 12 | 55 |
| | Defoaming property | | Good | Good | Good | Slightly poor |
| Multi-coating properties | 1st layer | | Good | Good | Good | Good |
| | 2nd layer | | Good | Good | Good | Cissing observed |
| | 3rd layer | | Good | Good | Good | Cissing observed |
| | Pockmarks | | Nil | Nil | Nil | Observed |
| Physical properties of the film | Thickness ($\mu$m) | Average value | 33.5 | 37.2 | 17.2 | 37 |
| | | Standard deviation | 1.25 | 1.58 | 0.62 | 2.62 |
| | Tensile strength (MN/m$^2$) | Average value | 33.5 | 34.1 | 33.4 | 31.4 |
| | | Standard deviation | 2.1 | 2.3 | 2.2 | 9.2 |
| | | Fluctuation in strength | Small | Small | Small | Substantial |
| | Coloring | | Nil | Nil | Nil | Nil |
| Sedimentation stability (change after 1 month) | | | No problem | No problem | No problem | No problem |
| Overall evaluation | | | Good | Good | Good | Poor |

The PTFE aqueous dispersion composition of the present invention has a good friction stability, is substantially free from formation of agglomerates during the production and use, and thus can be used suitably. Further, with the PTFE aqueous dispersion composition of the present invention, foams are readily extinguishable, and multi-coating is possible. During the coating, no "cissing" will be observed, and the sintered PTFE film is free from coloration, and there will be no substantial fluctuation in the thickness of the obtained film.

INDUSTRIAL APPLICABILITY

The PTFE aqueous dispersion composition of the present invention is useful for various conventional applications. For example, it can be used for an application wherein it is impregnated and coated on a glass fiber cloth or a carbon fiber cloth and sintered to obtain a roof material for a film structured building or a high frequency circuit board, an application wherein it is coated and sintered on a metal plate, then peeled to obtain a film which is used as a capacitor dielectric for an electric insulating material, a cell application wherein its paste with a powder of an active substance such as manganese dioxide, nickel hydroxide or carbon, is coated on an electrode plate, an application wherein it is coated on the surface of a cooking utensil, an application wherein a co-precipitate with a filler such as lead is processed to a bearing material of no-oil supplying type, an application as various binders utilizing fibrillation of PTFE, or an application wherein a plastic powder is added thereto to prevent dripping during incineration of plastics.

What is claimed is:

1. A polytetrafluoroethylene aqueous dispersion composition, which comprises from 30 to 65 wt % of fine particles of polytetrafluoroethylene obtained by emulsion polymerization, from 2 to 12 wt %, based on the polytetrafluoroethylene, of a nonionic surfactant, and at least 0.01 wt % and less than 1 wt %, based on the polytetrafluoroethylene, of at least one member selected from the group consisting of a polyethylene oxide having an average molecular weight of from 100,000 to 2,000,000 and a thickener based on a water-soluble polyurethane, wherein the composition has a viscosity of from 10 to 50 mPs, and
wherein the nonionic surfactant is at least one member selected from the group consisting of nonionic surfactants having molecular structures represented by the Formulae (1) and (2):

R—O—A—H    (1)

wherein R is an alkyl group having a straight chain or a branched chain represented by $C_xH_{2x+1}$ where x=8 to 18, and A is a polyoxyalkylene chain comprising from 5 to 20 oxyethylene groups and from 0 to 2 oxypropylene groups

R'—C$_6$H$_4$—O—A'—H    (2)

wherein R' is an alkyl group having a straight chain or a branched chain represented by $C_{x'}H_{2x'+1}$ where x'=4 to 12, and A' is a polyoxyethylene chain comprising from 5 to 20 oxyethylene groups.

2. The polytetrafluoroethylene aqueous dispersion composition according to claim 1 wherein the nonionic surfactant has a molecular structure represented by the Formula (1) wherein x is from 10 to 16, and A is a polyoxyalkylene chain comprising from 7 to 12 oxyethylene groups and from 0 to 2 oxypropylene groups.

3. The polytetrafluoroethylene aqueous dispersion composition according to claim 1 wherein the nonionic surfactant has a molecular structure represented by the Formula (2) wherein x' is from 4 to 12, and A' is a polyoxyalkylene chain comprising from 7 to 12 oxyethylene groups.

4. The polytetrafluoroethylene aqueous dispersion composition as claimed in claim 1, wherein the nonionic surfactant is $C_{10}H_{21}CH(CH_3)CH_2O(C_2H_4O)_9C_3H_6OH$.

5. The polytetrafluoroethylene aqueous dispersion composition as claimed in claim 1, wherein the nonionic surfactant is $C_{13}H_{27}O(C_2H_4O)_8C_3H_6OH$ or $C_{13}H_{27}O(C_2H_4O)_{10}(C_3H_6O)_2H$.

6. The polytetrafluoroethylene aqueous dispersion composition as claimed in claim 1, wherein said thickener is obtained by reacting a polyisocyanate with a polyalkylene ether alcohol or by reacting a polyisocyanate with a polyalkylene ether polyol and a polyalkylene ether alcohol.

7. The polytetrafluoroethylene aqueous dispersion composition as claimed in claim 1, wherein the thickener has the following formula:

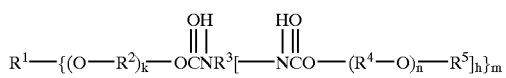

$$R^1\!\!-\!\!\{(O\!\!-\!\!R^2)_k\!\!-\!\!\overset{\overset{OH}{\|}}{O C N R^3}[\!\!-\!\!\overset{\overset{HO}{\|}}{NCO}\!\!-\!\!(R^4\!\!-\!\!O)_n\!\!-\!\!R^5]_h\}_m$$

wherein $R^1$ is a m-valent hydrocarbon group, each of $R^2$ and $R^4$ may be the same or different and are alkyene groups, $R^3$ is a (h+1) valent hydrocarbon group containing a urethane bond, $R^5$ is a branched hydrocarbon group, m is at least 2, h is at least 1, each of k and n is from 1 to 500, and $R^2$ and $R^4$ are ethylene groups.

8. The polytetrafluoroethylene aqueous dispersion composition as claimed in claim 1, wherein the thickener is represented by the following formula:

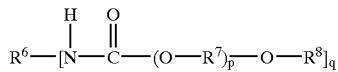

wherein $R^6$ is a q-valent hydrocarbon group which may contain a urethane bond, $R^7$ is an alkylene group, $R^8$ is a branched hydrocarbon group, p is from 1 to 500, q is at least 1, and $R^7$ is an ethylene group.

9. The polytetrafluoroethylene aqueous dispersion composition as claimed in claim 1, wherein an average particle size of the fine particles of polytetrafluoroethylene is from 0.15 to 0.3 microns.

10. A polytetrafluoroethylene aqueous dispersion composition consisting essentially of from 30 to 65 wt % of fine particles of polytetrafluoroethylene obtained by emulsion polymerization, and from 2 to 12 wt %, based on the polytetrafluoroethylene, of a nonionic surfactant having a molecular structure represented by the Formula (3):

wherein R is an alkyl group having a straight chain or a branched chain represented by $C_xH_{2x+1}$ where x=8 to 18, and B is a polyoxyalkylene chain comprising from 5 to 20 oxyethylene groups and from 1 to 2 oxypropylene groups, wherein the one or two oxypropylene groups are bonded to a terminus of the polyoxyalkylene chain.

11. The polytetrafluoroethylene aqueous dispersion composition according to claim 10, wherein the nonionic surfactant has a molecular structure represented by the Formula (3) wherein x is from 10 to 16, and B is a polyoxyalkylene chain comprising from 7 to 12 oxyethylene groups and from 1 to 2 oxypropylene groups.

* * * * *